United States Patent
Lin et al.

(10) Patent No.: US 8,056,024 B2
(45) Date of Patent: Nov. 8, 2011

(54) METHOD FOR MODIFYING PHOTOMASK LAYOUT

(75) Inventors: Chia-Wei Lin, Taipei County (TW); Kun-Yuan Chen, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 346 days.

(21) Appl. No.: 12/344,208

(22) Filed: Dec. 24, 2008

(65) Prior Publication Data
US 2010/0100865 A1 Apr. 22, 2010

(30) Foreign Application Priority Data
Oct. 17, 2008 (TW) ................................ 97139877 A

(51) Int. Cl.
*G06F 17/50* (2006.01)
(52) U.S. Cl. ................... 716/53; 716/51; 716/55
(58) Field of Classification Search ................ 716/55
See application file for complete search history.

(56) References Cited

U.S. PATENT DOCUMENTS

| 5,991,006 A | 11/1999 | Tsudaka |
| 7,384,710 B2 * | 6/2008 | Ogawa et al. ................ 430/5 |
| 2005/0229148 A1 * | 10/2005 | Melvin, III ................ 716/21 |
| 2006/0129968 A1 * | 6/2006 | Pierrat ................ 716/21 |
| 2007/0143733 A1 * | 6/2007 | Zach et al. ................ 716/19 |

* cited by examiner

*Primary Examiner* — Paul Dinh
*Assistant Examiner* — Bryce Aisaka
(74) *Attorney, Agent, or Firm* — Winston Hsu; Scott Margo

(57) ABSTRACT

A method for modifying a photomask layout includes the following steps. First, a photomask layout having at least an edge is provided. A plurality of evaluation points are positioned on the edge. Then, the photomask layout is interpreted to have an interpreted photomask layout and an interpreted edge pattern. The interpreted edge pattern is formed by interpreting the above-mentioned edge. After that, a shift between the edge and the interpreted edge and corresponding to each of the evaluation points is calculated. Afterwards, a shift gradient between two evaluation points can be derived from the shift. Finally, a number of segments between each two evaluation points can be estimated.

13 Claims, 6 Drawing Sheets

| Evaluation point | $S_n$ | $\triangle S_{n,n+1}$ |
|---|---|---|
| 1 | 8.23 | |
| 2 | 4.13 | 4.1 |
| 3 | 3.06 | 1.07 |
| 4 | 2.1 | 0.96 |
| 5 | 3.1 | -1 |

FIG. 5

METHOD FOR MODIFYING PHOTOMASK LAYOUT

BACKGROUND OF THE INVENTION

1. Field of the Invention

The preferred embodiment of the present invention is related to a method for modifying a photomask layout, and more particularly, to a method for estimating the number of dissections of an edge on a photomask layout before performing OPC (optical proximity correction).

2. Description of the Prior Art

In a photolithographic stage, an optical proximity effect often occurs, which jeopardizes the performance of a semiconductor device when patterns on the mask are transferred onto the wafer surface. Optical proximity effect causes deviation of patterns transferred on the wafer. Such deviations are usually related to the characteristics of the patterns to be transferred, the topology of the wafer, the source of the light, and various process parameters.

Optical proximity correction is one of the methods to correct and compensate for the deviations caused by the optical proximity effect. The commercially available OPC software can correct the original photomask layout using a theoretical image, so as to obtain correctly exposed photomask image layouts on the wafers.

The key point of the OPC is the dissection of the edges on an original photomask layout. In the traditional process, the manufacturer chooses hot points on the original photomask layout, and empirically estimates the number of segments of an edge on the hot point. Then, operational parameters including the number of segments are sent to the OPC software to obtain a corrected photomask layout. The above-mentioned original photomask layout refers to the desired photomask layout on the wafer after the photolithographic step. The hot point refers to regions at which the optical proximity effect often occurs. The hot point may be, for example, at the pitch or the bridge.

Although selecting many hot points can generate a more precise corrected photomask layout, much time is wasted in calculating the unneeded hot points. If, however, a hot point is not selected by the manufacturer based on his experience, the corrected photomask layout generated by the OPC software may become rough.

Therefore, a rule for selecting hot points and estimating dissecting segments is needed to replace the selection procedure based on human experience.

SUMMARY OF THE INVENTION

It is one of the objectives of the present preferred embodiment to provide a method for selecting hot points and estimating dissecting segments before proceeding an OPC process.

According to a preferred embodiment of the present invention, a method for modifying a photomask layout comprises: providing a photomask layout having at least an edge with at least a first evaluation point and a second evaluation point on the edge; interpreting the photomask layout to generate an interpreted photomask layout, wherein the interpreted photomask layout comprises an interpreted edge pattern, and the interpreted edge pattern has a third evaluation point corresponding to the first evaluation point and a fourth evaluation point corresponding to the second evaluation point; measuring a distance between the first evaluation point and the third evaluation point to obtain a first shift; measuring a distance between the second evaluation point and the fourth evaluation point to obtain a second shift; calculating a shift gradient between the first shift and the second shift; and determining the number of segment(s) between the first evaluation point and the second evaluation point.

According to another preferred embodiment of the present invention, a method for modifying a photomask layout comprises: providing a photomask layout having at least an edge with a plurality of evaluation points on the edge; interpreting the photomask layout to generate an interpreted photomask layout and an interpreted edge pattern, wherein the interpreted edge pattern is the edge after interpretation; measuring a shift disposed between the edge and the interpreted edge pattern and corresponding to each evaluation point; calculating a shift gradient between two adjacent evaluation points; and estimating the number of segment(s) between two adjacent evaluation points.

These and other objectives of the present preferred embodiment will no doubt become obvious to those of ordinary skill in the art after reading the following detailed description of the preferred embodiment that is illustrated in the various figures and drawings.

BRIEF DESCRIPTION OF THE DRAWINGS

FIG. 4b depicts a magnified localized region of FIG. 4a.

FIG. 5 is a table illustrating results of the shift gradient.

DETAILED DESCRIPTION

Figure 1:
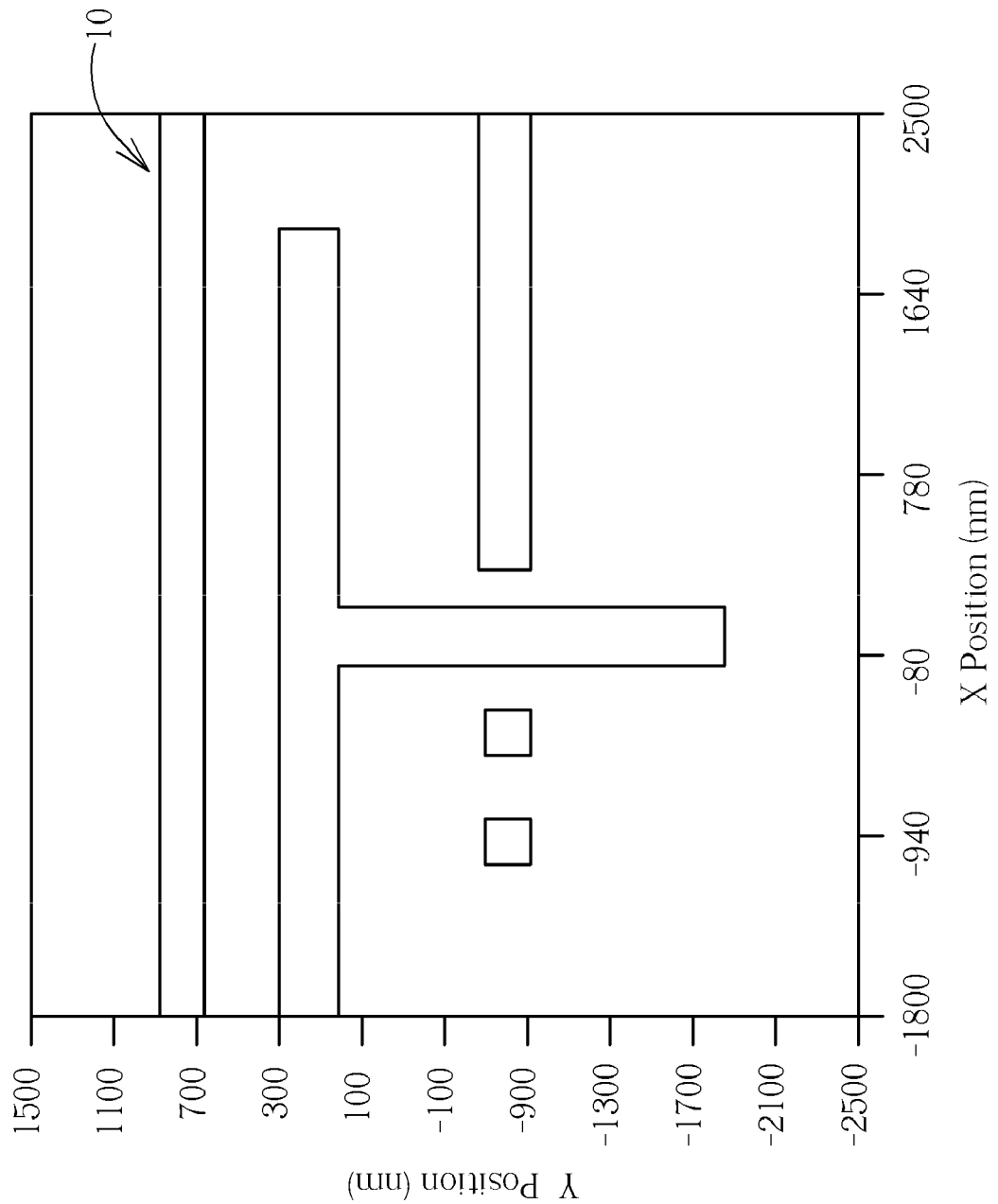
FIG. 1 depicts a schematic diagram illustrating an original photomask layout according to a preferred embodiment of the present invention.
Figure 2:
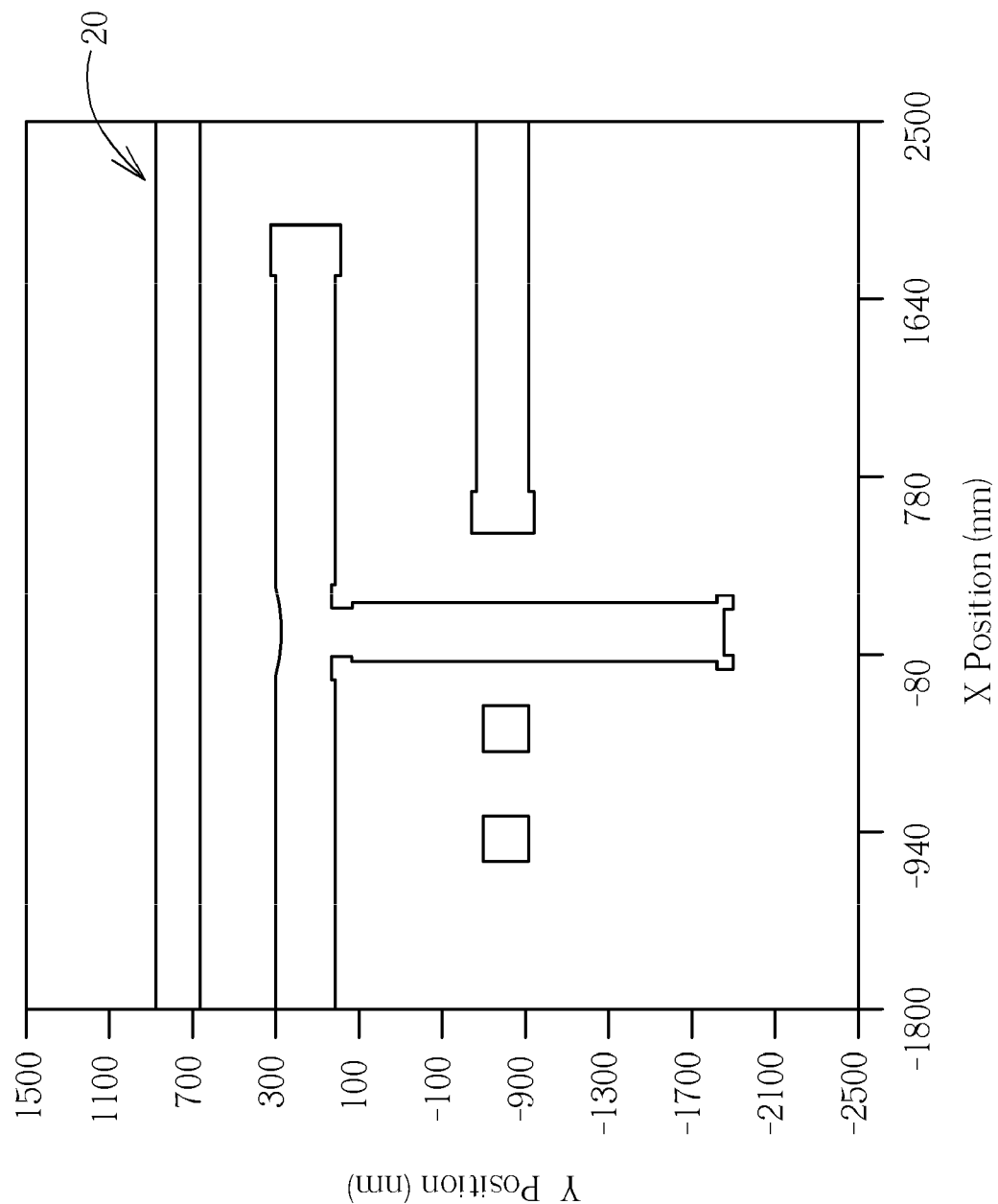
FIG. 2 depicts a schematic diagram illustrating a corrected photomask layout obtained by performing OPC on the original photomask layout.
Figure 3:
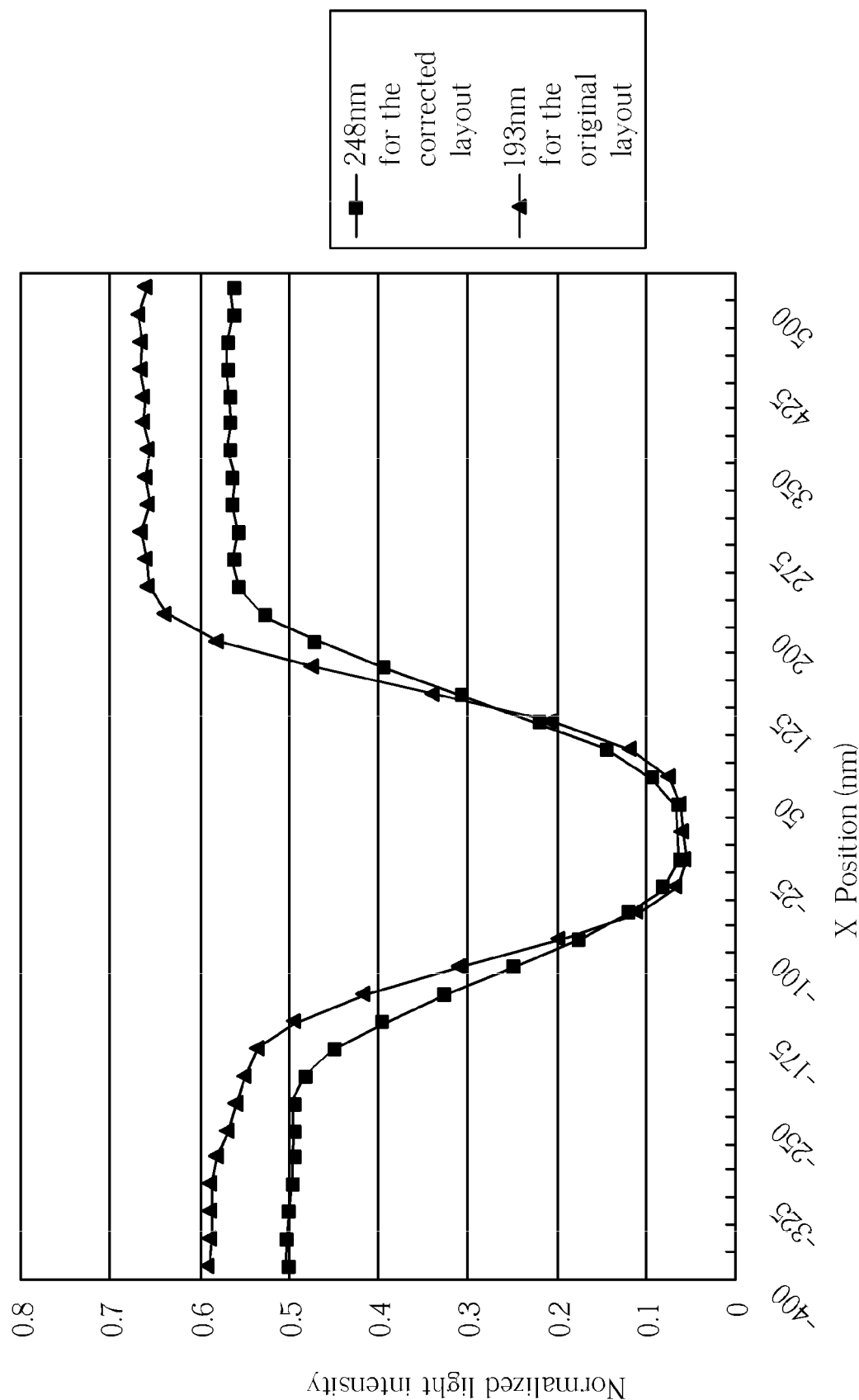
FIG. 3 depicts the normalized light intensity distribution vs. an X position of the original photomask layout and of the corrected photomask layout.

FIG. 1 depicts a schematic diagram illustrating an original photomask layout according to a preferred embodiment of the present invention. FIG. 2 depicts a schematic diagram illustrating a corrected photomask layout obtained by performing OPC on the original photomask layout. FIG. 3 depicts the normalized light intensity distribution vs. an X position of the original photomask layout and of the corrected photomask layout.

As shown in FIG. 1 and FIG. 2, an original photomask layout 10 and a corrected photomask layout 20 are depicted in FIG. 1 and FIG. 2, respectively. The corrected photomask layout 20 is generated by performing OPC on the original photomask layout 10.

First, the original photomask layout 10 is interpreted to obtain an interpreted contour of the original photomask layout 10 by utilizing simulation software with an operational parameter as 193 nm light source. A corrected photomask layout 20 is interpreted to obtain an interpreted contour of the corrected photomask layout 20 by utilizing the simulation software with an operational parameter as 248 nm light source. The interpreted contour of the original photomask layout 10 refers to the contour actually transferred onto a wafer after a photolithographic process. The interpreted contour of the corrected photomask layout 20 refers to the contour actually transferred onto a wafer after the photolithographic process.

Then, according to the interpreted contours of the original photomask layout 10 and the corrected photomask layout 20, the light intensity distributions of the interpreted contours of the original photomask layout 10 and the corrected photomask layout 20 are obtained, as is shown in FIG. 3.

The light intensity distribution of the interpreted contour of the original photomask layout 10 using a 193 nm light source and the light intensity distribution of the interpreted contour of the corrected photomask layout 20 using a 248 nm light source have similar tendencies.

That is, the interpreted contour of the original photomask layout 10 generated by using a 193 nm light source is similar to the interpreted contour of the corrected photomask layout 20 generated by using a 248 nm light source. Therefore, the interpreted contour of the original photomask layout 10 illuminated by the 193 nm light source can represent the major features of the interpreted contour of the corrected photomask layout 20 illuminated by the 248 nm light source. For example, hot points on the original photomask layout 10 can represent that the corresponding region of the corrected photomask layout 20 also has hot points.

Accordingly, for a lithographic process using a 248 nm light source, an interpreted contour of a corrected photomask layout can be approximately represented by an interpreted contour of an original photomask layout generated by using a 193 nm light source.

In this way, for a lithography process using a 248 nm light source, locations of hot points can be determined according to the interpreted contour of the original photomask layout using a 193 nm light source, before running OPC.

Although only 193 nm and 248 nm wavelength are described in the above, wavelengths other than 193 nm and 248 nm can be used in the present invention. Generally, before running OPC, the wavelength (193 nm in the above example) used to interpreting the original photomask is shorter than the wavelength (248 nm in the above example) used to exposing the wafer in the later lithographic process.

A method for modifying a photomask layout is described in the following.

Figure 4A:
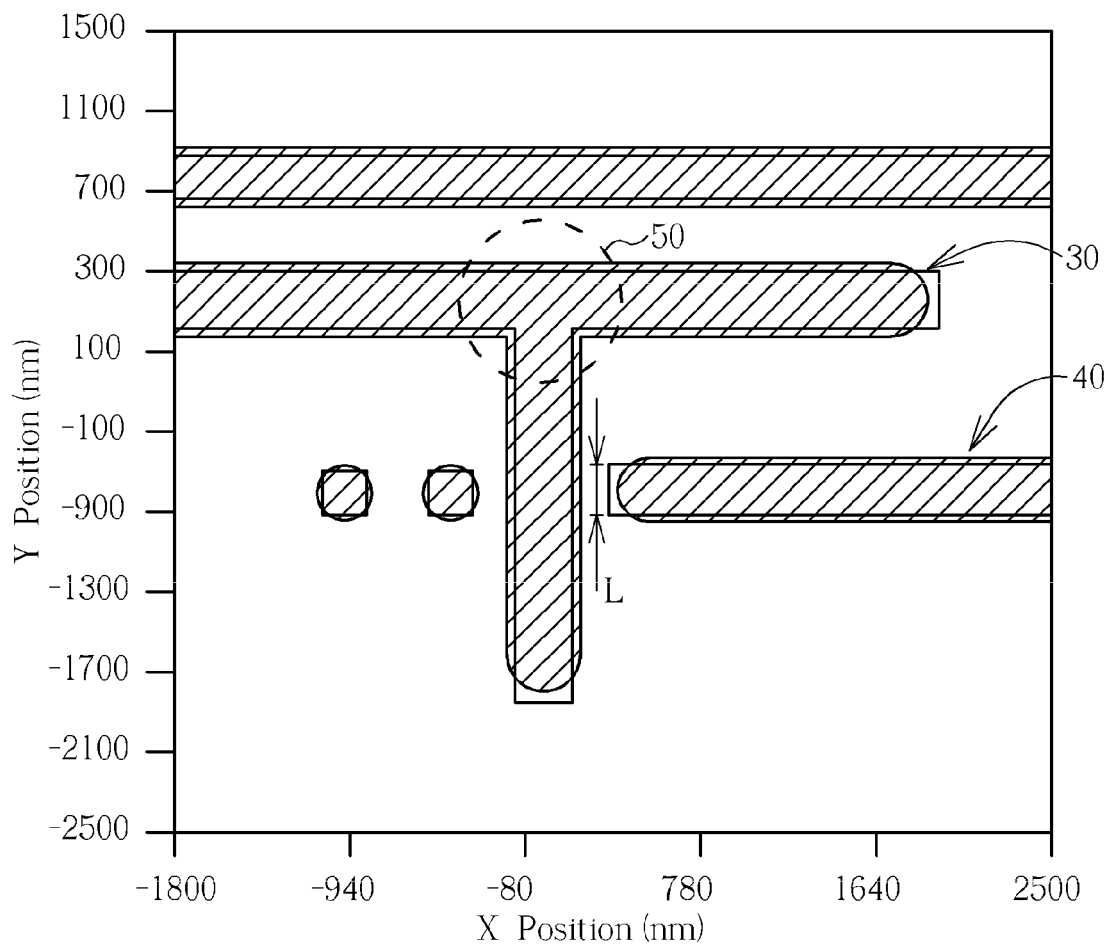
FIG. 4a depicts an original photomask layout and the interpreted photomask layout.
Figure 4B:
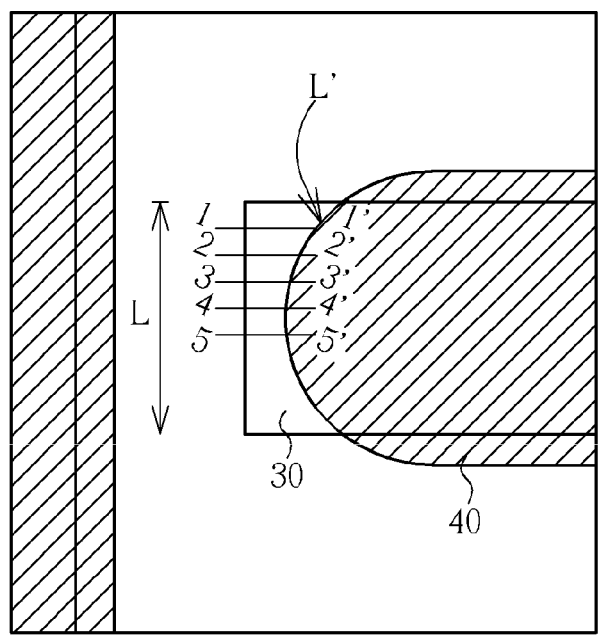

In the following preferred embodiment, a 193 nm light source is used. FIG. 4a depicts an original photomask layout and the interpreted photomask layout of the original photomask layout. FIG. 4b depicts a magnified localized region of FIG. 4a. FIG. 5 is a table illustrating results of the shift gradient.

As shown in FIG. 4a and FIG. 4b, an original photomask layout 30 is provided. The original photomask layout 30 is the desired photomask layout on the wafer after a lithographic process. Please refer to FIG. 4b. A plurality of evaluation points is disposed on the original photomask layout 30. For example, five evaluation points such as 1, 2, 3, 4 and 5 are disposed on an edge L. There are other evaluation points disposed on other regions of the original photomask layout 30 as well, which are omitted for brevity. Then, as shown in FIG. 4a, an interpreted photomask layout 40 (shown in sloping lines) is generated by interpreting the original photomask layout 30. The interpreted photomask layout 40 represents the layout transferred to a wafer by using the original photomask layout 30 as a mask after the photolithographic process. The interpretation of the original photomask layout 30 is performed by inputting simulation parameters such as wavelength of the light source (193 nm for this embodiment), the numerical aperture, and the shape of the light source into commercial simulation software. Then, the interpreted photomask layout 40 of the original photomask layout 30 can be generated.

As shown in FIG. 4b, an interpreted edge pattern L' is also generated after the edge L is interpreted with the original photomask layout 30. A plurality of evaluation points such as evaluation points 1', 2', 3', 4', 5' are disposed on the interpreted edge pattern L' and the evaluation points 1', 2', 3', 4', 5' correspond to the evaluation points 1, 2, 3, 4, 5, respectively. The evaluation points 1 and 1' are at the same Y position. The evaluation points 2 and 2', 3 and 3', 4 and 4', 5 and 5' are at the same Y position respectively. According to another preferred embodiment, the evaluation points can be at the same X position. The number of evaluation points on an edge should be greater than 2.

The shortest possible distance between evaluation points 1 and 1', 2 and 2', 3 and 3', 4 and 4', 5 and 5' is measured. The shortest distance between evaluation points 1 and 1', 2 and 2', 3 and 3', 4 and 4', 5 and 5' represent shifts between the edge L and the interpreted edge pattern L' and corresponds to evaluation points 1, 2, 3, 4, 5, respectively. Then, a first shift $S_1$, a second shift $S_2$, a third shift $S_3$, a fourth shift $S_4$, and a fifth shift $S_5$ can be obtained after the above mentioned measurement. A shift gradient of adjacent evaluation point is then calculated. The shift gradient is a change between the shifts of two adjacent evaluation points per unit distance. More specifically, the shift gradient is calculated by using the following equation (1).

$$\Delta S_{n,n+1} = (S_n - S_{n+1}) \div h_{n,n+1} \qquad (1)$$

wherein n is the number of evaluation points, n=1,2,3,4... (number of evaluation points−1), $S_{n,n+1}$ is the shift gradient between the evaluation points n and n+1, $S_n$ is the $n_{th}$ shift, and h is the distance between two adjacent evaluation points on the edge L (for example, $h_{1,2}$ is the distance between evaluation points 1 and 2; $h_{2,3}$ is the distance between the evaluation points 2 and 3).

Please refer to FIG. 5. The results of the shifts and shift gradients are illustrated in FIG. 5. The first shift $S_1$ corresponding to evaluation point 1 is 8.23, the second shift $S_2$ corresponding to evaluation point 2 is 4.1, the third shift $S_3$ corresponding to evaluation point 3 is 3.06, the fourth shift $S_4$ corresponding to evaluation point 4 is 2.1, and the fifth shift $S_5$ corresponding to evaluation point 5 is 3.1. The shift gradient between evaluation point 1 and 2 is 4.1, the shift gradient between evaluation point 2 and 3 is 1.07, the shift gradient between evaluation point 3 and 4 is 0.96, and the shift gradient between evaluation point 4 and 5 is −1.

In this way, the number of segment(s) between two adjacent evaluation points can be estimated according to the shift gradient between the two adjacent evaluation points. According to applicants' research, the higher the shift gradient, the greater the number of segments required. A higher shift gradient between two adjacent points means a more severe optical proximity effect occurs between the two adjacent points. Therefore, a greater number of segments is needed between the two adjacent points to correct the optical proximity effect.

In this way, the manufacturer can compare each shift gradient to estimate the number of segments between two adjacent evaluation points, and input the estimation into commercial OPC software.

Take the above embodiment as an example: the shift gradient between evaluation points 1 and 2 is 4.1 is the highest among other shift gradients. The shift gradient between evaluation points 4 and 5 is −1 which is lower than the shift gradient between evaluation points 1 and 2. Therefore, a greater number of segments is needed between evaluation points 1 and 2 than between evaluation points 4 and 5.

As mentioned above, there is a plurality of evaluation points disposed in every region of the original photomask layout 30. All the evaluation points will go through the shift gradient calculation. A region with high shift gradient may be defined as a hot point, such as the edge L. In another preferred embodiment, a T-shaped region marked by a circle 50 in FIG. 4a is identified as a hot point as well.

Then, a number of segments between adjacent evaluation points can be estimated according to the gradient shifts of the evaluation points on the hot point. Therefore, before running OPC, hot points of the original photomask layout 30 can be selected according to gradient shifts rather than according to a manufacturers' experience.

Figure 6:
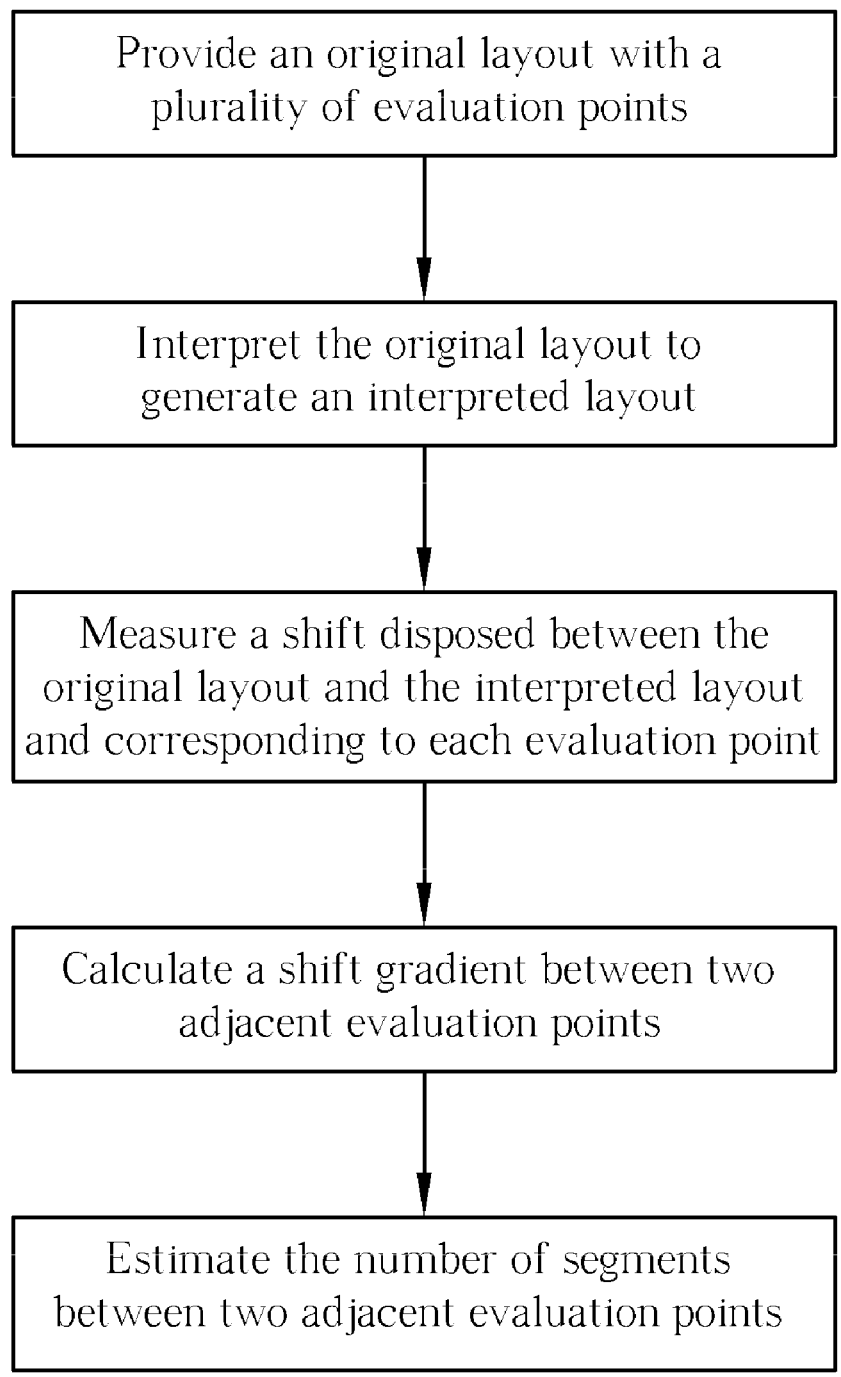
FIG. 6 shows a flow chart of a method for modifying a photomask layout according to a preferred embodiment of the present invention.

FIG. 6 shows a flow chart of the method for modifying photomask layout according to a preferred embodiment of the present invention.

First, an original photomask layout with a plurality of evaluation points is provided. Then, the original photomask layout is interpreted to generate an interpreted photomask layout. After that, a shift disposed between the original photomask layout and the interpreted photomask layout and corresponding to each evaluation point is measured. Subsequently, shift gradients between two adjacent evaluation points are calculated. Later, a number of segments between two adjacent evaluation points is estimated according to the shift gradients.

All in all, the preferred embodiment of the present invention provides a method to estimate positions of hot points and number of segments by theoretical data rather than manufacturers' experience. Therefore, hot points are selected more precisely and a number of dissections becomes more accurate.

Those skilled in the art will readily observe that numerous modifications and alterations of the device and method may be made while retaining the teachings of the invention.

What is claimed is:

1. A method for modifying a photomask layout to obtain a correctly exposed photomask image layout on a wafer comprising:
    providing a photomask layout having at least an edge with at least a first evaluation point and a second evaluation point on the edge by using a computer;
    interpreting the photomask layout to generate an interpreted photomask layout, wherein the interpreted photomask layout comprises an interpreted edge pattern, and the interpreted edge pattern has a third evaluation point corresponding to the first evaluation point and a fourth evaluation point corresponding to the second evaluation point;
    measuring a distance between the first evaluation point and the third evaluation point to obtain a first shift;
    measuring a distance between the second evaluation point and the fourth evaluation point to obtain a second shift;
    calculating a shift gradient between the first shift and the second shift, wherein the shift gradient is calculated by using the following equation:

$$\Delta S = (S_1 - S_2) \div h$$

wherein $\Delta S$ is the shift gradient, $S_2$ is the second shift, $S_1$ is the first shift, and h is the distance between the first evaluation point and the second evaluation point; and
    estimating a number of segment(s) between the first evaluation point and the second evaluation point.

2. The method of claim 1, wherein the number of segment(s) is proportional to the shift gradient.

3. The method of claim 1, wherein the edge is at a line end.

4. The method of claim 1, wherein the edge is at a T-shaped region.

5. The method of claim 1, wherein the distance between the first evaluation point and the third evaluation point is the shortest possible.

6. The method of claim 1, wherein the distance between the second evaluation point and the fourth evaluation point is the shortest possible.

7. The method of claim 1, wherein the first evaluation point is at the same X position as the third evaluation point.

8. The method of claim 1, wherein the first evaluation point is at the same Y position as the third evaluation point.

9. The method of claim 1, wherein the second evaluation point is at the same X position as the fourth evaluation point.

10. The method of claim 1, wherein the second evaluation point is at the same Y position as the fourth evaluation point.

11. A method for modifying a photomask layout to obtain a correctly exposed photomask image layout on a wafer comprising:
    providing a photomask layout having at least an edge with a plurality of evaluation points on the edge by using a computer;
    interpreting the photomask layout to generate an interpreted photomask layout and an interpreted edge pattern, wherein the interpreted edge pattern is the edge after interpretation;
    measuring shifts disposed between the edge and the interpreted edge pattern and corresponding to each evaluation point;
    after measuring the shifts, calculating a shift gradient between two adjacent evaluation points, wherein the shift gradient is a change between the shifts of two adjacent evaluation points per unit distance; and
    estimating a number of segment(s) between two adjacent evaluation points.

12. The method of claim 11, wherein the number of segment(s) is proportional to the shift gradient.

13. The method of claim 11, wherein the distance between each two adjacent evaluation points is the shortest possible.

* * * * *